(12) United States Patent
Lee et al.

(10) Patent No.: US 11,855,000 B2
(45) Date of Patent: Dec. 26, 2023

(54) SEMICONDUCTOR DEVICE HAVING EMI SHIELDING STRUCTURE AND RELATED METHODS

(71) Applicant: Amkor Technology Singapore Holding Pte. Ltd., Valley Point (SG)

(72) Inventors: Young Woo Lee, Gyeonggi-do (KR); Jae Ung Lee, Seoul (KR); Byong Jin Kim, Gyeonggi-do (KR); EunNaRa Cho, Incheon-si (PT); Ji Hoon Oh, Gyeonggi-do (KR); Young Seok Kim, Seoul (KR); Jin Young Khim, Seoul (KR); Tae Kyeong Hwang, Seoul (KR); Jin Seong Kim, Chanderl, AZ (US); Gi Jung Kim, Phoenix, AZ (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 17/832,952

(22) Filed: Jun. 6, 2022

(65) Prior Publication Data
US 2022/0302043 A1 Sep. 22, 2022

Related U.S. Application Data

(62) Division of application No. 16/857,439, filed on Apr. 24, 2020, now Pat. No. 11,355,449, which is a
(Continued)

(51) Int. Cl.
*H01L 23/31* (2006.01)
*H01L 23/552* (2006.01)
(Continued)

(52) U.S. Cl.
CPC .......... *H01L 23/552* (2013.01); *H01L 21/486* (2013.01); *H01L 21/4853* (2013.01);
(Continued)

(58) Field of Classification Search
CPC . H01L 23/552; H01L 21/4853; H01L 21/486; H01L 21/4889; H01L 21/565;
(Continued)

(56) References Cited

U.S. PATENT DOCUMENTS 5,043,534 A 8/1991 Mahulikar
5,557,142 A 9/1996 Gilmore
(Continued)

*Primary Examiner* — Trang Q Tran
(74) *Attorney, Agent, or Firm* — Kevin B. Jackson

(57) ABSTRACT

An electronic device structure having a shielding structure includes a substrate with an electronic component electrically connected to the substrate. The shielding structure includes conductive spaced-apart pillar structures that have proximate ends connected to the substrate and distal ends spaced apart from the substrate, and that are laterally spaced apart from the first electronic component. In one embodiment, the conductive pillar structures are conductive wires attached at one end to the substrate with an opposing end extending away from the substrate so that the conductive wires are provided generally perpendicular to the substrate. A package body encapsulates the electronic component and the conductive spaced-apart pillar structures. In one embodiment, the shielding structure further includes a shielding layer disposed adjacent the package body, which is electrically connected to the conductive spaced-apart pillar structures. In one embodiment, the electrical connection is made through the package. In another embodiment, the electrical connection is made through the substrate.

20 Claims, 14 Drawing Sheets

Related U.S. Application Data division of application No. 15/632,335, filed on Jun. 24, 2017, now abandoned.

(51) Int. Cl.
*H01L 23/00* (2006.01)
*H01L 23/498* (2006.01)
*H01L 21/48* (2006.01)
*H01L 21/56* (2006.01)
*H01L 23/538* (2006.01)
*H01L 25/065* (2023.01)

(52) U.S. Cl.
CPC ........ *H01L 21/4889* (2013.01); *H01L 21/565* (2013.01); *H01L 23/3114* (2013.01); *H01L 23/49811* (2013.01); *H01L 23/49827* (2013.01); *H01L 23/49838* (2013.01); *H01L 24/16* (2013.01); *H01L 21/561* (2013.01); *H01L 23/3128* (2013.01); *H01L 23/49816* (2013.01); *H01L 23/5383* (2013.01); *H01L 23/5384* (2013.01); *H01L 25/0655* (2013.01); *H01L 2224/16227* (2013.01); *H01L 2224/73204* (2013.01); *H01L 2224/97* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/19107* (2013.01); *H01L 2924/3025* (2013.01)

(58) Field of Classification Search
CPC ........... H01L 23/3114; H01L 23/49811; H01L 23/49827; H01L 23/49838; H01L 24/16; H01L 21/561; H01L 23/3128
See application file for complete search history.

(56) References Cited

U.S. PATENT DOCUMENTS

| | | |
|---|---|---|
| 5,614,694 A | 3/1997 | Gorenz, Jr. |
| 6,686,649 B1 | 2/2004 | Mathews |
| 6,853,055 B1 | 2/2005 | Kuang |
| 7,030,469 B2 | 4/2006 | Mahedevan |
| 8,012,868 B1 | 9/2011 | Santos Naval |
| 8,269,320 B2 | 9/2012 | Huang |
| 8,362,598 B2 | 1/2013 | Park |
| 8,558,365 B1 | 10/2013 | Roa |
| 8,618,659 B2 * | 12/2013 | Sato ................. H01L 23/13 257/737 |
| 8,624,374 B2 | 1/2014 | Ding |
| 8,729,682 B1 | 5/2014 | Davis |
| 9,153,543 B1 | 10/2015 | Mangrum |
| 9,362,209 B1 | 6/2016 | Mangrum |
| 10,141,269 B2 | 11/2018 | Jeon |
| 2005/0030661 A1 | 12/2005 | Zhao |
| 2007/0030661 A1 | 2/2007 | Morris |
| 2007/0170582 A1 | 7/2007 | Nomura |
| 2008/0014678 A1 | 1/2008 | Howard |
| 2008/0149381 A1 | 6/2008 | Kawagishi |
| 2008/0310114 A1 | 12/2008 | Pawlenko |
| 2009/0152688 A1 | 6/2009 | Do |
| 2012/0218729 A1 | 8/2012 | Cary |
| 2012/0280386 A1 | 11/2012 | Sato |
| 2014/0367160 A1 | 12/2014 | Yu |
| 2015/0348936 A1 | 12/2015 | Lin |
| 2016/0056055 A1 * | 2/2016 | Ko ................. H01L 21/4853 438/126 |
| 2016/0079204 A1 | 3/2016 | Matsubara |
| 2016/0095218 A1 | 3/2016 | Sakurai |
| 2016/0118337 A1 * | 4/2016 | Yoon ................. H01L 24/82 257/774 |
| 2017/0103968 A1 | 4/2017 | Prabhu |
| 2017/0263565 A1 | 9/2017 | Renard |
| 2018/0122774 A1 | 5/2018 | Huang |

\* cited by examiner

SEMICONDUCTOR DEVICE HAVING EMI SHIELDING STRUCTURE AND RELATED METHODS

CROSS-REFERENCE TO RELATED APPLICATIONS

The present application is a divisional application of U.S. patent application Ser. No. 16/857,439 filed on Apr. 24, 2020 and issued as U.S. Pat. No. 11,355,449 on Jun. 7, 2022, which is a divisional application of U.S. patent application Ser. No. 15/632,335 filed on Jun. 24, 2017 and now abandoned, which are expressly incorporated by reference herein, and priority thereto is hereby claimed.

BACKGROUND OF THE DISCLOSURE

The present invention relates, in general, to electronics, and more particularly, to semiconductor packages, structures thereof, and methods of forming semiconductor packages.

Radio Frequency (RF) shielding is required on certain semiconductor devices in order to minimize Electro-Magnetic Interference (EMI) radiation from the semiconductor device. RF shielding is further required to prevent RF radiation from external sources from interfering with operation of the semiconductor device.

In the past, RF shielding was generally accomplished in several ways. A first method was to attach a metal can over the component after the component was attached to a substrate, such as a printed circuit board. However, this approach has several problems. First, an attached shield has been a costly and a low yielding process. An attached shield has also been problematic due to flux creep after the shield was attached. Additionally, the attached shields have had delamination and extrusion issues. In addition, externally attached shields soldered to the printed circuit board have required additional board space.

Another method was to embed the RF shield. In the embedded shield method, a metal RF shield was directly attached to the semiconductor package substrate using, for example, a solder or a conductive adhesive. In some embodiments, the shield was fully embedded within the mold compound of the finished package. In other embodiments, the shield was exposed after assembly. In either instance, the addition of a metal shield as a component attached to the top surface of the substrate was problematic for several reasons. First, the addition of a metal shield as a component attached to the top surface of the substrate required a significant amount of additional space on the package substrate. Second, it has been difficult to transfer mold in and around the metal shield to encapsulate the semiconductor package completely. Furthermore, in some instances external shields have required that liquid dispense encapsulation of the integrated circuit (IC) be used, which dramatically increased the cost.

A further method used a conformal shield. In this method, all of the components were placed on a substrate and the substrate, or strip, was over-molded using unit molding, or pin gate molding where individual mold caps were defined within the strip such that upward facing, exposed pads in the substrate remained exposed after the mold operation. A conductive coating was then applied to the strip such that it covered the units and also made electrical contact to the upward facing pads. The strip was then singulated into individual units. While this technique eliminated the molding process concerns associated with the embedded shield method described previously, it did not eliminate the added substrate size required to form the so-called upward facing, exposed pads.

Accordingly, it is desirable to have a structure and a method of forming a packaged semiconductor device that addresses the issues noted previously as well as others. It is also desirable for the structure and method to accommodate existing manufacturing flows and to be cost effective.

BRIEF SUMMARY

The present description includes, among other features, an electronic device, such as a semiconductor device having a shielding structure configured to minimize the effects of EMI radiation and RF radiation. The shielding structure includes a plurality of conductive spaced-apart pillar structures attached at one end to a substrate and placed proximate to an electronic die. In some embodiments, the conductive spaced-apart pillar structures are conductive wires formed using wire-bonding processes whereby the conductive wires are attached at a proximate end to the substrate with a distal end extending away from the substrate. The distal ends are not attached or are not physically connected to the substrate. That is, the conductive spaced-apart pillar structures, such as conductive wires, are attached to the substrate at only one end. The conductive wires can be generally perpendicular or orthogonal (that is, an angle of about 90 degrees) to a major surface of the substrate. In some embodiments, the conductive wire can be referred to as a vertical wire, which means the conductive wire is generally perpendicular to the major surface of the substrate to which the conductive wire is attached. In other embodiments, the conductive spaced-apart pillar structures can be formed using plating or sputtering techniques.

In some embodiments, the shielding structure further includes a conductive shielding layer, which can be a conformal layer disposed at least partially around a package body to further increase the shielding efficiency of the electronic device. The conductive shielding layer can be electrically connected to the conductive spaced-apart pillar structures through the package body, for example by exposing end or tip portions of the pillar structures, or through the substrate, for example by connecting the conductive shielding layer to one or more conductive layers exposed along a side surface of the substrate. In other embodiments, the conductive shielding layer is not electrically connected to the conductive spaced-apart pillar structures. In some embodiments, the conductive shielding layer can be connected to ground using an external interconnect structure.

In one embodiment, an electronic device structure having a shielding structure comprises a substrate and a first electronic component electrically connected to the substrate. The shielding structure comprises a plurality of conductive spaced-apart pillar structures, wherein the plurality of conductive spaced-apart pillar structures have proximate ends connected to the substrate, have distal ends spaced apart from the substrate, and are laterally spaced apart from the first electronic component. A package body encapsulates the first electronic component and the plurality of conductive spaced-apart pillar structures. In some embodiments, the shielding structure further includes a shielding layer disposed adjacent to the package body. In some embodiments, distal ends of the spaced-apart conductive pillar structures extend to be disposed above a major surface of the first electronic die. In some embodiments, the shielding layer and the conductive spaced-apart pillar structures are electrically connected together.

In another embodiment, a semiconductor device structure having a shielding structure comprises a substrate having a first major surface and an opposing second major surface. A first semiconductor die is electrically connected to the substrate adjacent the first major surface. The shielding structure comprises conductive wires having proximate ends attached to the substrate adjacent the first major surface and distal ends spaced apart from the first major surface, wherein the conductive wires are laterally spaced apart from the first semiconductor die. A package body encapsulates the first semiconductor die and conductive wires. In some embodiments, the shielding structure further comprises a shielding layer comprising a conductive material disposed adjacent the package body. In some embodiments, the shielding layer and the conductive wires are in electrical communication.

In a further embodiment, a method of forming an electronic device structure having a shielding structure comprises providing a substrate having a first electronic component connected to the substrate. The method includes forming conductive wires on the substrate laterally spaced apart from the first electronic component, wherein proximate ends of the conductive wires are attached to the substrate and distal ends of the conductive wires extend away from the substrate. The method includes forming a package body encapsulating the first electronic component and the conductive wires. The method includes forming a conductive shielding layer adjacent the package body and electrically connected to the conductive wires, wherein shielding structure comprises the conductive shielding layer and the conductive wires.

By using a lower-cost wire-bonding process to form the conductive wire structure, a more diverse and easily modifiable shielding structure is provided. This also facilitates placing the shielding structure closer to the electronic die so the overall size of the electronic device can be reduced compared to other shielded devices. In addition, since the conductive wires can be formed to be substantially orthogonal to the substrate, wire-sweeping defects can be reduced from occurring during the formation of the package body.

Moreover, the present embodiments enable the use of strip base substrates instead of requiring unit base substrates thereby simplifying the manufacturing process of the electronic device and improving productivity. For example, even though a conductive shielding layer is formed only on a surface of an encapsulant and a side surface of the encapsulant is directly exposed to the outside through, for example a sawing process, the conductive pillar structures are provided between the side surface of the package body and a side surface of an electronic die, thereby safely shielding top and side portions of the electronic die from EMI radiation.

Other examples and embodiments are further disclosed herein. Such examples and embodiments can be found in the figures, in the claims, and/or in the present disclosure.

Figure 1A:
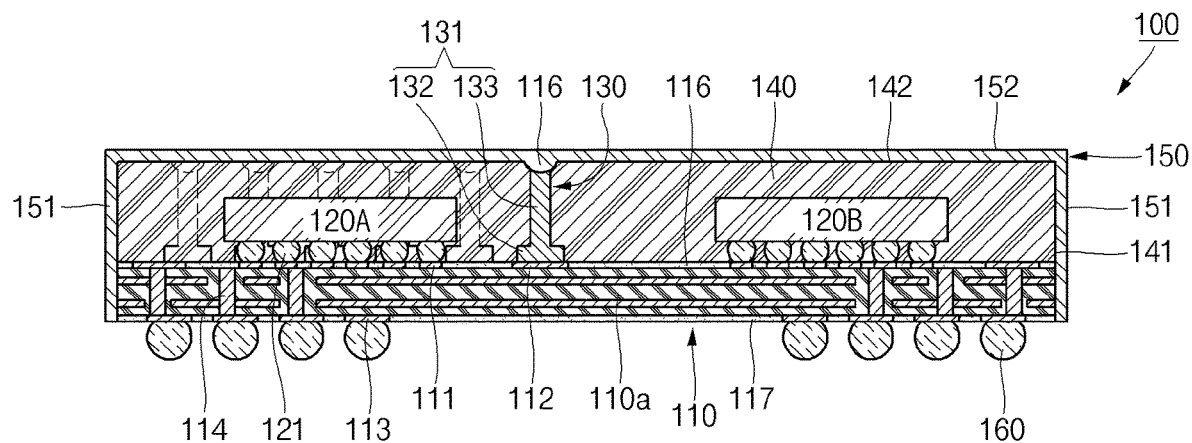
FIGS. 1A, 1B, and 1C illustrate a cross-sectional view, a plan view and a partially enlarged view of an electronic device according to various embodiments of the present invention.

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. can be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures, or characteristics can be combined in any suitable manner, as would be apparent to one of ordinary skill in the art, in one or more embodiments. Additionally, the term while means a certain action occurs at least within some portion of a duration of the initiating action. Unless specified otherwise, spatially relative terms, such as beneath, under, bottom, below, lower, above, top, upper, and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as below or beneath other elements or features would then be oriented above the other elements or features. Thus, the exemplary term below can encompass both an orientation of above and below. The device can be otherwise oriented (rotated 90 degrees or at other orientations) and the spatially relative descriptors used herein can be interpreted accordingly. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or can be practiced in the absence of any element that is not specifically disclosed herein.

DETAILED DESCRIPTION OF THE DRAWINGS

Figure 1B:
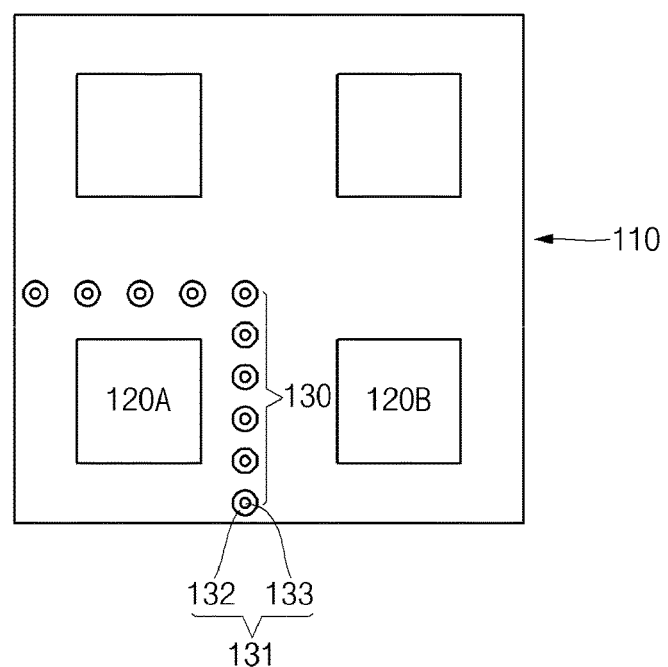
Figure 1C:
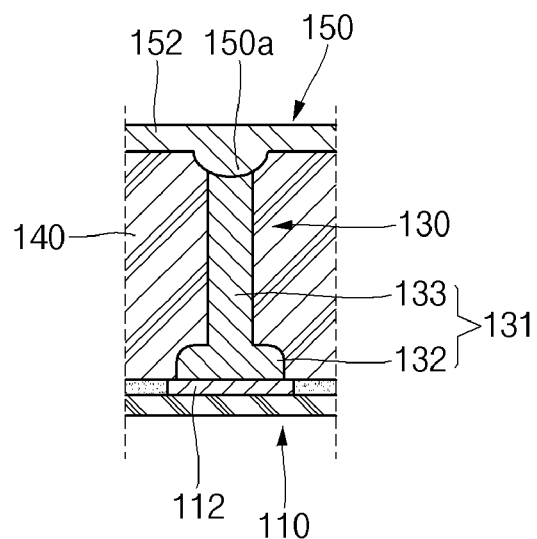

FIGS. 1A, 1B, and 1C illustrate a cross-sectional view, a plan view, and a partially enlarged view respectively of an electronic device structure 100 having a shielding structure, such as a semiconductor device structure 100, in accordance with one embodiment.

As illustrated in FIGS. 1A and 1B, the semiconductor device structure 100 includes a substrate 110; an electronic component 120A, such as an electronic die 120A or semiconductor die 120A; an electronic component 120B, such as an electronic die 120B or a semiconductor die 120B; a first shielding structure 130 or an internal shielding structure 130; a package body 140 or an encapsulant 140; and a second shielding structure 150 or a shielding layer 150. In the present embodiment, the semiconductor die 120A and the semiconductor die 120B are attached to a first major surface of the substrate 110, and are laterally spaced-apart from each other. In other embodiments, another semiconductor die or electronic component can be stacked on top of one more of the semiconductor die 120A or the semiconductor die 120B. In some embodiments, the semiconductor device 100 can further include at least one external interconnection structure 160 attached to a second major surface of the substrate 110. In accordance with the present embodiment, the internal shielding structure 130 comprises a plurality of conductive spaced-apart pillar structures 131 encapsulated within package body 40 as generally illustrated in FIG. 1A. According to the present embodiment, the conductive spaced-apart pillar structures 131 are attached to the substrate 110 at one end only, and the opposite end is spaced apart from the substrate 110 as generally illustrated in FIG. 1A. In some embodiments, the conductive spaced-apart pillar structures 131 are vertical conductive wires or vertical wires with one end attached to the substrate 110 and the opposite end detached from the substrate 110.

In some instances, the substrate 110 may include a dielectric layer 110a, at least one first circuit pattern 111 (or conductive trace, land, pad, or similar structures as known to those skilled in the art) formed on a top surface of the dielectric layer 110a and electrically connected to the semiconductor die 120A, the semiconductor die 120B, at least one second circuit pattern 112 (or conductive trace, land, pad, or similar structures as known to those skilled in the art) formed on the top surface of the dielectric layer 110a and electrically connected to the conductive spaced-apart pillar structures 131, at least one third circuit pattern 113 formed on a bottom surface of the dielectric layer 110a and configured to be electrically connected to an external circuit board, and one or more conductive vias 114 passing through the dielectric layer 110a.

In some embodiments, the first circuit pattern 111 and the second circuit pattern 112 can be spaced-apart from each other, and can be electrically connected to or isolated from each other. The conductive vias 114 may electrically connect the first circuit pattern 111 and the third circuit pattern 113, or second circuit pattern 112 and the third circuit pattern 113, to each other. Some of the conductive vias 114 can be used for signals, one or more of the conductive vias 114 can be used for power, and one or more of the conductive vias 114 can be used for a ground. In accordance with the present embodiment, one of the conductive vias 114 is electrically connected to the conductive spaced-apart pillar structures 131 and can be used for a ground. In addition, the first and second circuit patterns 111 and 112 can be partially covered by a protection layer 116 and the third circuit pattern 113 can be partially covered by a protection layer 117.

In some embodiments, the substrate 110 comprises a rigid printed circuit board, a flexible printed circuit board, a core circuit board, a coreless circuit board, a buildup circuit board, or other structures as known to those skilled in the art. It is understood that all or any features of the substrate 110 can be commonly applied to substrates according to other embodiments described herein.

In some embodiments, semiconductor die 120A and semiconductor die 120B can be generally rectangular in shape, and may include one or more contact pads (or bonding pads, redistribution pads, or similar structures as known to those skilled in the art) and at least one internal interconnection structure 121 connected to the contact pad. For example, the internal interconnection structure 121 may include various types of structures for electrically bonding the semiconductor die 120A and the semiconductor die 120B to the first circuit pattern 111 of the substrate 110, including microbumps, metal pillars, solder bumps, solder balls, or similar structures as known to those skilled in the art. In an example embodiment, the internal interconnection structure 121 may include a copper pillar having solder bumps or solder caps to be bonded to the substrate 110 by mass reflow or thermal compression. For example, the internal interconnection structure 121 may have pitches ranging from about 20 microns to about 50 microns and/or pitches ranging from about 90 microns to about 100 microns.

The semiconductor die 120A and the semiconductor die 120B may include an integrated circuit die separated from a semiconductor wafer. For example, one or more the semiconductor die 120A and the semiconductor die 120B may include, but are not limited to, electrical circuits, such as digital signal processors (DSPs), network processors, power management units, audio processors, RF circuits, wireless baseband system-on-chip (SOC) processors, sensors, application specific integrated circuits (ASICs), discrete devices, and/or passive devices, such as capacitors, resistors, and/or inductors. In other embodiments, the semiconductor die 120A and/or the semiconductor die 120B can be separately packaged or encapsulated before attachment to the substrate 110. It is understood that all or any features of the semiconductor die 120A and the semiconductor die 120B including the internal interconnection structure 121 can be commonly applied to semiconductor dies according to other embodiments described herein.

Although not illustrated, an underfill material may further fill a gap between the semiconductor die 120A and the substrate 110 and the semiconductor die 120B and the substrate 110. The underfill material can protect the internal interconnection structure 121 and allows the semiconductor die 120A, the semiconductor die 120B, and the substrate 110 to be mechanically connected to each other. The underfill material can be pre-coated on the semiconductor die 120A, the semiconductor die 120B and/or the substrate 110 before the semiconductor die 120A and the semiconductor die 120B are electrically connected to the substrate 110. Alternatively, the underfill material may fill a gap between the semiconductor die 120A and the substrate 110, and the semiconductor die 120B and the substrate 110, by means of a capillary after the semiconductor die 120A, the semiconductor 120B and the substrate 110 are electrically connected to each other. In some embodiments, the underfill material may have an organic filler or an inorganic filler or can be a non-conductive paste without an organic or inorganic filler.

In some embodiments, the underfill material is not used. For example, if a filler size of the encapsulant used for package body 140 is smaller than a gap size between the semiconductor die 120A and the substrate 110, and the semiconductor die120B and the substrate 110, the encapsulant used for package body 140 can be sufficiently injected into the gap.

In accordance with the present embodiment, internal shielding structure 130 comprises the conductive spaced-apart pillar structures 131, such as the conductive wires 131. In some embodiments, the conductive wires 131 are arranged at a constant pitch proximate to the semiconductor die 120A and the semiconductor die 120B. Although the conductive wires 131 are illustrated as arranged in a single row, the conductive wires 131 can also be arranged in two rows or in three or more rows. As will be described later, adjacent rows of conductive wires 131 can be aligned or offset with respect to each other. In other embodiments, the pitch between the conductive wires 131 may vary in accordance with portions of the semiconductor die 120A and/or the semiconductor die 120B that are more susceptible to EMI radiation, or emit more EMI radiation, than other portions of the respective semiconductor die.

In some embodiments, the conductive wires 131 have a proximate end electrically connected to the second circuit pattern 112 provided in the substrate 110 and a distal end that extends away from substrate 110. In accordance with the present embodiment, the distal ends of the conductive wires 131 are not attached to the substrate 110. As generally illustrated in FIG. 1A, in some embodiments, conductive wires 131 are generally perpendicular or orthogonal to the first major surface of the substrate 100. In an example embodiment, each conductive wire 131 may include a ball-bonding region 132 that is electrically connected to the second circuit pattern 112, and an extending wire region 133 upwardly extending from the ball-bonding region 132 a predetermined length in a substantially vertical direction. In one preferred instance, a height of the extending wire region 133 is equal to or greater than a thickness (or height) of the semiconductor die 120A and the semiconductor die 120B. That is, the distal ends of the conductive wires 131 are disposed above the major surfaces of the semiconductor die 120A and the semiconductor die 120B.

In some embodiments, the conductive wires 131 can be copper wire, gold wire, aluminum wire, or similar materials as known to those skilled in the art. For example, the conductive wires 131 can be formed from a general wire bonder. In an example embodiment, the conductive wires 131 may have a diameter in a range of about one micron to about 100 microns, preferably in the range of about five microns to about 50 microns, and more preferably in the range of about 10 microns to about 30 microns. If the diameter of the conductive wires 131 is smaller than about one micron, the conductive wires 131 can be susceptible to unwanted wire-sweep during the encapsulation step that forms the package body 140. If the diameter of the conductive wires 131 is greater than about 100 microns, in some embodiments it can be difficult for the conductive wires 131 to be bonded to the substrate 110.

To facilitate wire bonding, gold wire can be used for conductive wires 131. In the alternative, because of mechanical strength and costs, copper wire can be used for conductive wires 131. In other embodiments, the conductive spaced-apart pillar structures 131 can be formed as a metal pillar or a metal post disposed on the second circuit pattern 112 using plating, plating processes, sputtering processes, deposition processes, combinations thereof, or other processes known to those skilled in the art.

In some embodiments, the conductive wires 131 are provided having a pitch smaller than a wavelength of EMI to be shielded. For example, if the RF radiation to be shielded is in a band ranging from about one kilohertz (kHz) to about 100 gigahertz (GHz), the conductive wires 131 can be provided having a pitch ranging from about 100 microns to about 10 millimeters (mm).

In accordance with the present embodiment, the conductive wires 131 are configured to increase the EMI shielding efficiency between the semiconductor die 120A and the semiconductor die 120B, or to reduce external EMI from being radiated into one or more of the semiconductor die 120A and the semiconductor die 120B. In accordance with the present embodiment, internal shielding structure 130 is configured as a shielding structure embedded within or internal to the package body 140 to provide EMI shielding for the electronic components contained within the package body 140. It is understood that all or any features of the internal shielding structure 130 including the conductive wires 131 can be commonly applied to other embodiments described herein.

In some embodiments, the package body 140 comprises an encapsulant configured to encapsulate, enclose, or cover the semiconductor die 120A, the semiconductor die 120B, and the internal shielding structures 130 disposed on the substrate 110 to safely protect these elements from the external environment. In some embodiments, the package body 140 comprises a thermally curable epoxy mold compound or a thermally curable epoxy mold resin. For example, the package body 140 comprises an inorganic filler (for example, silica), an epoxy resin, a curing agent, a flame retardant, a curing promoter, a release agent, and other components as known to those skilled in the art.

In some instances, the package body 140 includes first surfaces 141, which are substantially coplanar with edge surfaces (that is, side surfaces) of the substrate 110, and a second surface 142 oriented at a substantially right angle to the first surfaces 141. Stated differently, the second surface 142 is formed to be substantially horizontal with respect to, or substantially parallel to, a lengthwise direction of the substrate 110. It is understood that all or any of the features of the package body 140 can be commonly applied to other embodiments described herein.

In some embodiments, the shielding layer 150 is integrally formed with, is conformal with, or is adjacent to the first surfaces 141 of the package body 140, the edges of the substrate 110, and the second surface 142 of the package body 140. More particularly, in one embodiment, the shielding layer 150 comprises first regions 151 disposed adjacent the first surfaces 141 of the package body 140 and disposed adjacent the edges of the substrate 110 as generally illustrated in FIG. 1A. In addition, the shielding layer 150 comprises second regions 152 disposed adjacent the second surface 142 of the package body 140 as generally illustrated in FIG. 1A. In such a manner, the shielding layer 150 is shaped to enclose the semiconductor device 100 in a cap, cap-like, or conformal (that is, follows the profile of the structure is adjacent to or attached to) configuration. In accordance with the present embodiment, the shielding layer 150 can be electrically connected to a ground circuit pattern provided on the substrate 110, which can also be electrically connected to the internal shielding structure 130.

To shield EMI, the shielding layer 150 can be formed from a variety of materials, such as conductive materials. For example, the shielding layer 150 comprises one or more of copper (Cu), nickel (Ni), gold (Au), silver (Ag), platinum (Pt), cobalt (Co), titanium (Ti), chrome (Cr), zirconium (Zr), molybdenum (Mo), ruthenium (Ru), hafnium (Hf), tungsten (W), rhenium (Re), graphite, carbon black, combinations thereof, and/or other materials known to those skilled in the art. In some embodiments, the shielding layer 150 may further include a binder to allow internal metal particles to be bonded to one another and to be bonded to surfaces of the package body 140 and the substrate 110.

In other embodiments, the shielding layer 150 may include a conductive polymer, such as polyacetylene, poylaniline, polypyrrole, polythiophene or poly sulfur nitride, which is doped with a metal or a metal oxide. In addition, the shielding layer 150 may include a conductive ink prepared by mixing conductive materials, such as carbon black, graphite, or silver. By way of example, the conductive ink can be used for identification marks or other marking purposes.

By way of example, the shielding layer 150 has a thickness ranging from about 0.1 micron to about 1000 microns, preferably from about one micron to about 100 microns, and more preferably from about 10 microns to about 30 microns. If the thickness of the shielding layer 150 is smaller than about 0.1 micron, the EMI shielding efficiency can be lower than a predetermined reference level. If the thickness of the shielding layer 150 is greater than 1000 microns, the processing time required to form the shielding layer 150 can be extended for an undesirable period.

The shielding layer 150 can be formed by, for example, spin coating, spraying, plating, sputtering, combination thereof, and/or other process techniques known to those skilled in the art. It is understood that all or any of the features of the shielding layer 150 can be commonly applied to other embodiments described herein.

In some embodiments, the external interconnection structure 160 is connected to the third circuit pattern 113 of the substrate 110. For example, the external interconnection structure 160 comprises metal pillars, solder bumps, solder balls, bumps, lands, and/or other structures known to those skilled in the art. The external interconnection structure 160 may include 100 micron thick to 200 micron thick bumps, or 20 micron thick to 100 micron thick bumps/pillars. When solder bumps are used for the external interconnection structure 160, the external interconnection structure 160 may include at least one solder metal melted at a lower temperature than other metals. Therefore, the external interconnection structure 160 provides for physical, electrical bonding between the semiconductor device 100 and an external circuit board or other devices in a melting process or a subsequent cooling process. For example, the external interconnection structure 160 may include a ball grid array (BGA) and/or a land grid array (LGA). Although solder balls are illustrated as an example, the external interconnection structure 160 may include any of diverse types of structures. It is understood that all or any of the features of the external interconnection structure 160 can be commonly applied to other embodiments described herein.

Turning now to FIG. 1C, an end (that is, a distal end) of the conductive wire 131 of the internal shielding structure 130 can be electrically connected to the shielding layer 150. In one embodiment, a protrusion 150a can be additionally formed in or as part of the shielding layer 150 to be electrically connected to the distal ends of the conductive wires 131 of the internal shielding structure 130. Therefore, even if the internal shielding structure 130 is not directly connected to a ground pattern, it can be grounded through the shielding layer 150, which can be electrically connected to ground by side regions 151 connected to the substrate 110.

After the conductive wires 131 of the internal shielding structure 130 are encapsulated by the package body 140, portions of the package body 140 corresponding to the locations of the distal ends of the conductive wires 131 are removed by, for example, laser ablation, thereby allowing the distal ends or edges of the conductive wires 131 to be exposed to the outside of the package body 140. More particularly, recesses having a predetermined depth are formed at locations corresponding to the distal ends or edges of the conductive wires 131. As a result, the protrusion(s) 150a is formed efficiently in the recess as the shielding layer 150 is formed.

In accordance with the present embodiment, the internal shielding structure 130 as described previously is provided by the conductive wires 131 (or the conductive spaced-apart pillar structures 131) disposed proximate to the semiconductor die 120A, and the shielding layer 150 is provided on one or more surfaces of the package body 140. Accordingly, the EMI generated from the semiconductor die 120A is shielded from the semiconductor die 120B adjacent to the semiconductor die 120A. In addition, the EMI generated from the semiconductor die 120A and the semiconductor die 120B is shielded within the semiconductor device 100 and the amount of EMI emitted to the outside of the semiconductor device 100 is reduced. Further, the effects of external EMI on the semiconductor device 100 are reduced.

More particularly, because the sides of the semiconductor die 120A are enclosed by the internal shielding structure 130 provided by the plurality of conductive wires 131, the effects of the EMI generated from either semiconductor die (for example, semiconductor die 120A or semiconductor die 120B) within the semiconductor device 100 is effectively shielded from the other semiconductor die (for example, semiconductor die 120B or semiconductor die 120A).

Additionally, in accordance with the present embodiment the internal shielding structure 130 is provided at low costs because the conductive wires 131 can be formed using a wire bonding process. Therefore, the internal shielding structure 130 can be formed at reduced costs, compared to the conventional shielding structures.

With reference now to FIGS. 2 to 6, schematic diagrams illustrating various embodiments of the conductive spaced-apart pillar structures 131, such as the conductive wires 131, for the internal shielding structure 130 will now be described.

Figure 2:
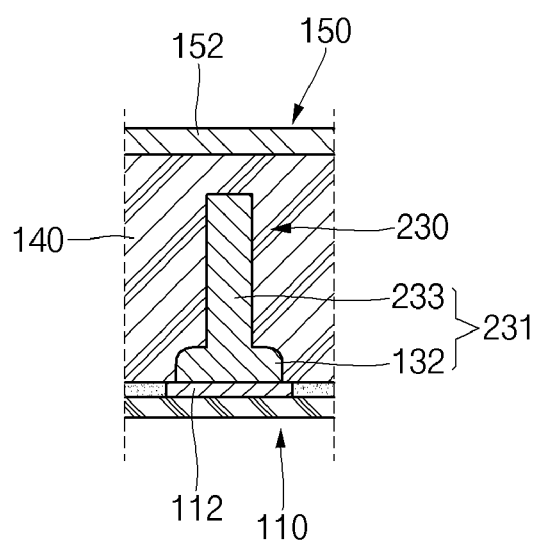
FIGS. 2, 3, 4, 5, and 6 are schematic diagrams illustrating various types of conductive wires in an electronic device according to various embodiments of the present invention.

As illustrated in FIG. 2, an end (that is, a distal end) of a conductive pillar structure 231 of an internal shielding structure 230 is spaced-apart from the shielding layer 150 without being electrically connected to the shielding layer 150 through the package body 140. In one embodiment, the conductive pillar structure 231 is configured as a conductive wire 231. In one embodiment, a filler and a resin used to form package body 140 can be interposed between the distal end of an extending wire region 233 of the conductive wire 231 and the shielding layer 150. In this embodiment, the conductive wire 231 can be electrically connected to a ground conductive via (that is, one of the conductive vias 114 illustrated in FIG. 1A) in the substrate 110. In one embodiment, the internal shielding structure 230 is formed by performing over molding or film assisted molding on the conductive wire 231 to provide the package body 140 without being followed by a removal step, such as a grinding process.

Figure 3:
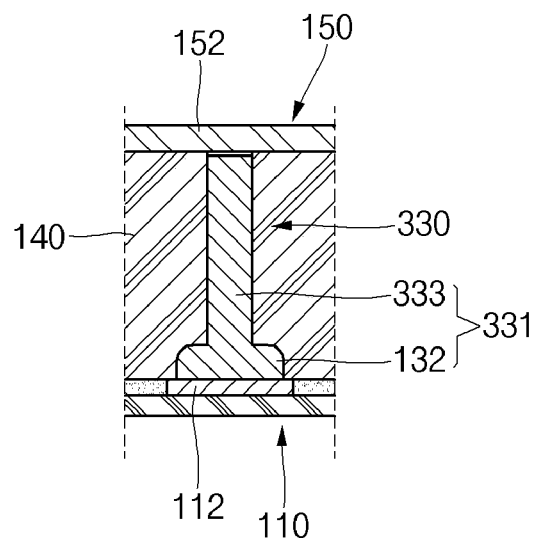

As illustrated in FIG. 3, an end (that is, a distal end) of a conductive pillar structure 331 in an internal shielding structure 330 is spaced-apart from the shielding layer 150. In one embodiment, the conductive pillar structure 331 is configured as a conductive wire 331 having an extending wire region 333 and the ball-bonding region 132. In this embodiment, the distal end of the extending wire region 333 is spaced-apart from the shielding layer 150 without being electrically connected to the shielding layer 150 through the package body 140. In accordance with the present embodiment, only the resin portion of the package body 140 is interposed between the distal end of the conductive wire 331 and the shielding layer 150. In this embodiment, the conductive wire 331 can be electrically connected to a ground conductive via 114 (as illustrated in FIG. 1) in the substrate 110.

Figure 4:
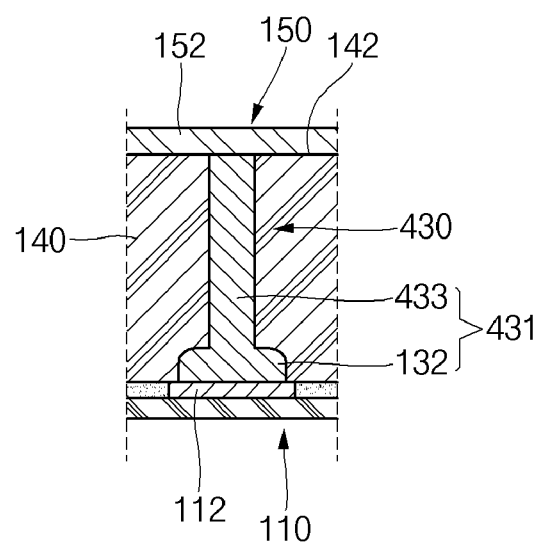

As illustrated in FIG. 4, an end (that is, a distal end) of a conductive pillar structure 431 is substantially coplanar with the second surface 142 of the package body 140. In one embodiment, the conductive pillar structure 431 is configured as a conductive wire 431 having an extending wire region 433 and the ball-bonding region 132. In this embodiment, the distal end of the extending wire region 433 is substantially coplanar with the second surface 142 of the package body 140. In accordance with the present embodiment, the distal end of the conductive wire 431 is electrically connected to the shielding layer 150. In one embodiment, the internal shielding structure 430 is provided by performing over-molding or film-assisted molding on the conductive wire 431 and then additionally grinding the package body 140 until the distal end of the conductive pillar structure 431 (for example, the distal end of the extending wire region 433) is exposed to the outside of the package body 140. In accordance with the present embodiment, the shielding layer 150 is electrically connected to the conductive pillar structure 431 (for example, the conductive wire 431) through the package body 140.

Figure 5:
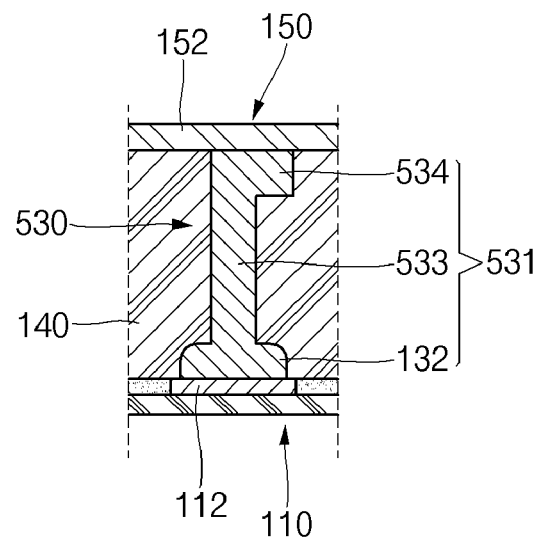

As illustrated in FIG. 5, a distal end of a conductive pillar structure 531 (for example, a conductive wire 531) in an internal shielding structure 530 is bent to provide a bent region 534. In accordance with the present embodiment, the bent region 534 of the conductive pillar structure 531 is electrically connected to the shielding layer 150 through the package body 140. In one embodiment, the internal shielding structure 530 is provided by performing over-molding on the conductive pillar structure 531 in a manner in which the distal end (for example, the bent region 534) of the conductive pillar structure 531 is brought into physical contact with a mold. More particularly, during an encapsulation step to form package body 140, the distal end of the conductive pillar structure 531 (for example, the conductive wire 531) is brought into contact with the mold and is bent at a predetermined angle.

Figure 6:
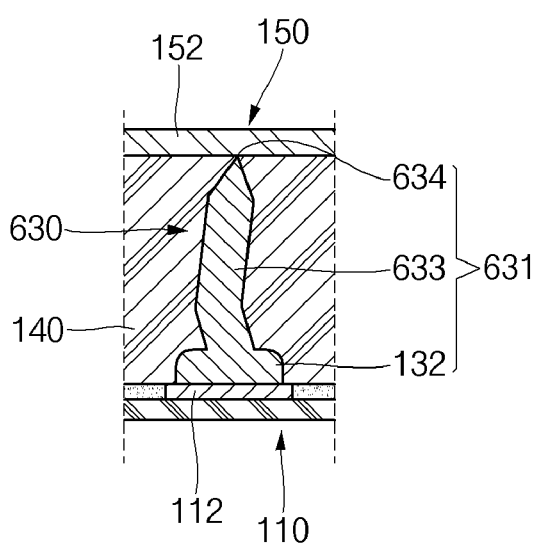

As illustrated in FIG. 6, a distal end of a conductive pillar structure 631, such as a conductive wire 631 of an internal shielding structure 630 has a pointed shape. More particularly, an apex 634 is formed at the distal end of an extending wire region 633 in the conductive wire 631. In one embodiment, the apex 634 is provided using a wire bonder configured to perform ball bonding and stitch bonding. In one embodiment, a first end of the conductive wire 631 is ball-bonded to the second circuit pattern 112 (the ball-bonding region 132 is formed at this stage), and a second end of the conductive wire 631 is stitch-bonded so as to not practically achieve bonding. By doing so, only a diameter of the conductive wire 631 is reduced and a region of the conductive wire 631 having the reduced diameter is forcibly severed. At this stage, the extending wire region 633 having the apex 634 is formed. The process of forming the conductive wire 631 using a wire bonder apparatus will be further described later.

In one embodiment, the apex 634 of the conductive wire 631 is electrically connected to the shielding layer 150 as generally illustrated in FIG. 6. In an alternative embodiment, the apex 643 is spaced apart from the shielding layer 150. In the alternative embodiment, conductive wire 631 can be electrically connected to a ground conductive via (for example, one of conductive vias 114 illustrated in FIG. 1A) in the substrate 110.

Figure 7:
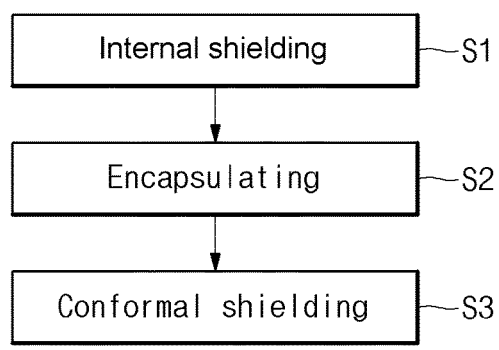
FIG. 7 is a flowchart of a manufacturing method of an electronic device according to various embodiments of the present invention.

Referring now to FIG. 7, a flowchart of a manufacturing method for providing the electronic device 100 or semiconductor device 100 according to various embodiments is provided. As illustrated in FIG. 7, the manufacturing method comprises internal shielding (S1), encapsulating (S2), and conformal shielding (S3). Those skilled in the art will recognize that the manufacturing method according to the present embodiment may include other steps, such as preparing a substrate, bonding electronic components, and forming an external interconnection structure. However, the detailed description of these known steps will not be given.

Figure 8A:
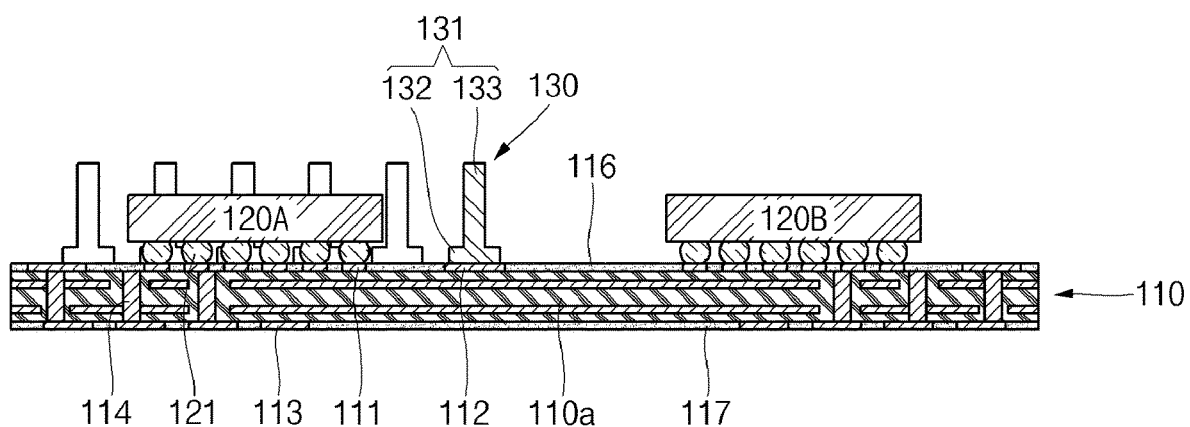
FIGS. 8A, 8B, and 8C are cross-sectional views illustrating a manufacturing method of an electronic device according to various embodiments of the present invention.
Figure 8B:
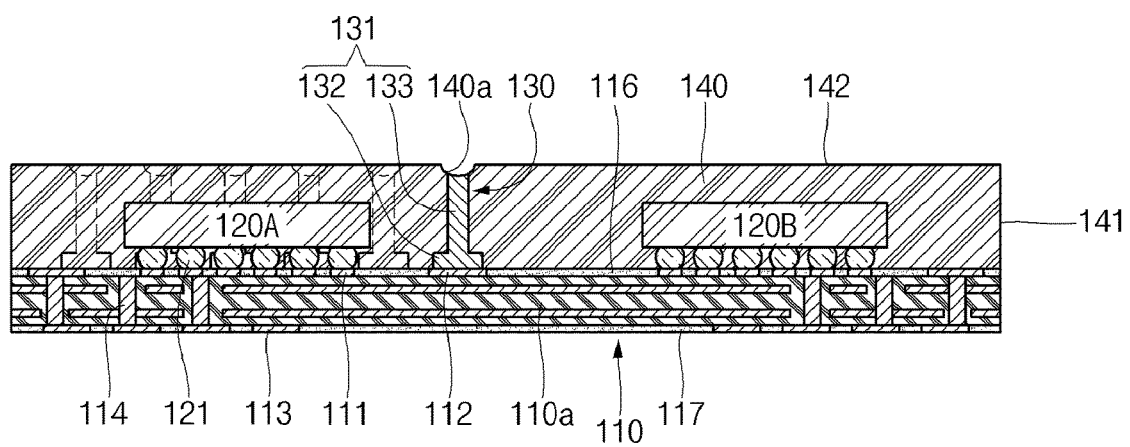
Figure 8C:
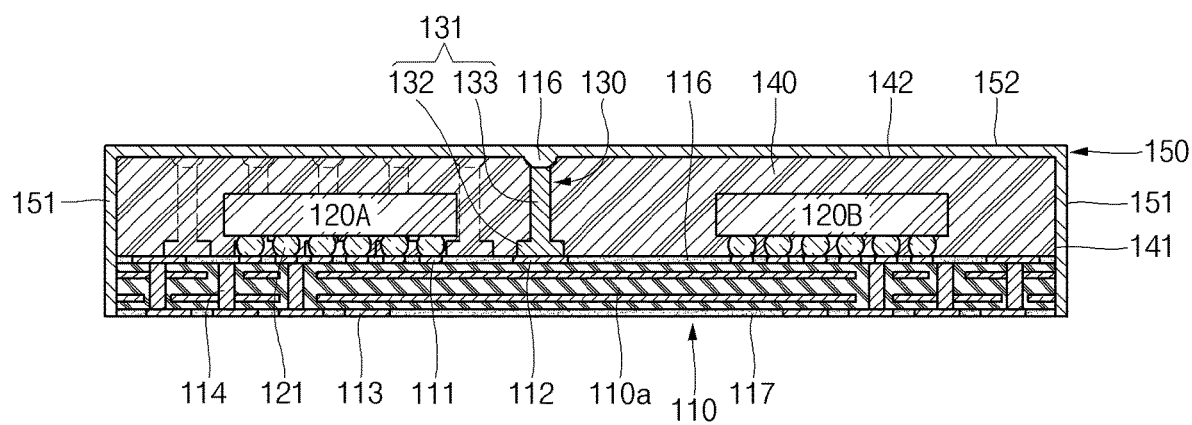

Referring now to FIGS. 8A to 8C, cross-sectional views illustrating a manufacturing method of the semiconductor device 100 according to various embodiments are provided.

As illustrated in FIG. 8A, in one embodiment of the step of internal shielding (S1), the internal shielding structure 130 is provided by further forming a plurality of conductive pillar structures 131, such as conductive wires 131 having proximate ends attached onto a substrate 110 in proximity to the semiconductor dies 120A and 120B.

In some embodiments, first ends or proximate ends of the conductive wires 131 are ball-bonded to a second circuit pattern 112 of the substrate 110 by, for example, a wire bonder, and second ends or distal ends of the conductive wires 131 are upwardly extended a predetermined length to then be severed, thereby providing the conductive wires 131. In accordance with the present embodiment, the distal ends of the conductive wires 131 are not attached to the substrate 110. In one embodiment, a ball-bonding region 132 is disposed on the second circuit pattern 112 by the wire bonder, and an extending wire region 133 upwardly extending a predetermined length from the ball-bonding region 132 is then formed, thereby providing the conductive wires 131. In some embodiments, heights (or lengths) of the conductive wires 131 can be greater than thicknesses (or heights) of the semiconductor dies 120A and 120B. That is, the distal ends of the conductive wires 131 extend above the substrate 110 to a greater extent than the semiconductor dies 120A and 120B.

As illustrated in FIG. 8B, in the step of encapsulating (S2), the package body 140 is formed to encapsulate the semiconductor dies 120A and 120B and the internal shielding structure 130 disposed on the substrate 110.

In accordance with one embodiment, even if the substrate 110 is provided on a strip basis or configuration, the step of encapsulating (S2) can be performed on a unit basis. More particularly, a plurality of encapsulated units can be formed on a single substrate strip. Therefore, first surfaces 141 of the package body 140, which are adjacent to each other, can be configured to face each other.

The step of encapsulating (S2) can be performed by, for example, general compression molding (that is, using liquid, powder and/or a film), vacuum molding, transfer molding, over molding, film-assisted molding, or other techniques known to those skilled in the art. After the step of encapsulating (S2), portions of the package body 140 can be removed by, for example grinding until the internal shielding structure 130 is exposed to the outside. In other embodiments, portions of the package body 140 corresponding to the locations of the internal shielding structure 130 are subjected to laser ablation to form recesses 140a. In some instances, the grinding or laser ablation step is not performed. It is understood that other removal techniques, such as etching (either with or without a mask) can be used.

As illustrated in FIG. 8C, in the step of conformal shielding (S3), the shielding layer 150 having a predetermined thickness is formed on or adjacent the first surfaces 141 of the package body 140, edges of the substrate 110 and the second surfaces 142 of the package body 140. In one embodiment, the first regions 151 of the shielding layer 150 are formed at the first surfaces 141 of the package body 140 and the edges of the substrate 110, and the second region(s) 152 of the shielding layer 150 are formed at the second surface(s) 142 of the package body 140. In accordance with the present embodiment, the shielding layer 150 can be electrically connected to a ground pattern provided on the substrate 110, and the internal shielding structure 130 also can be electrically connected to the shielding layer 150 as generally illustrated in FIG. 8C. The shielding layer 150 can be formed by, for example, spin coating, spraying, plating, sputtering, combinations thereof, or other techniques known to those skilled in the art.

FIGS. 9A to 9G are schematic diagrams illustrating a process of forming the conductive wires 131 for an internal shielding structure 130 in a manufacturing method for forming semiconductor device 100 according to various embodiments. In accordance with the various embodiments, the conductive wire 131 can be formed by modifying a general wire bonding process in accordance with the present embodiments, which will now be described.

Figure 9A:
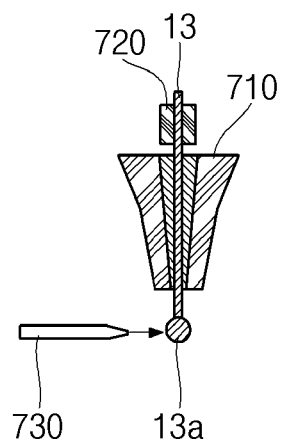
FIGS. 9A, 9B, 9C, 9D, 9E, 9F, and 9G are schematic diagrams illustrating a process of forming conductive wires for an internal shielding structure in a manufacturing method of an electronic device according to various embodiments of the present invention.

First, a ceramic capillary 710, a wire bonder including a clamp 720 positioned on the capillary 710, and a discharge electrode 730 positioned under the capillary 710 are prepared. In one embodiment, a wire 13 is disposed to pass through the capillary 710 and the clamp 720. As illustrated in FIG. 9A, in a state in which the clamp 720 positioned on the capillary 710 clamps the wire 13, a free air ball 13a is formed at a bottom end of the wire 13 having passed through the capillary 710 by the discharge electrode 730. Next, the substrate 110 having the second circuit pattern 112 formed thereon is positioned on a heating block (not shown) to be heated by the heating block.

Figure 9B:
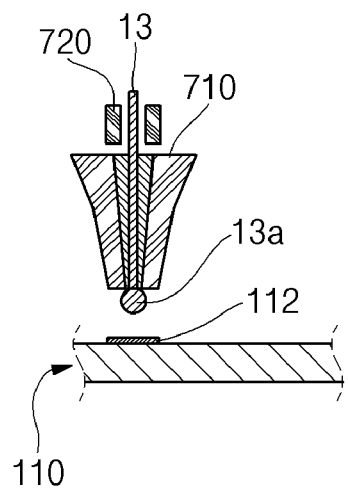

As illustrated in FIG. 9B, in a state in which the clamp 720 unclamps the wire 13, the capillary 710 moves toward the second circuit pattern 112 of the underlying substrate 110.

Figure 9C:
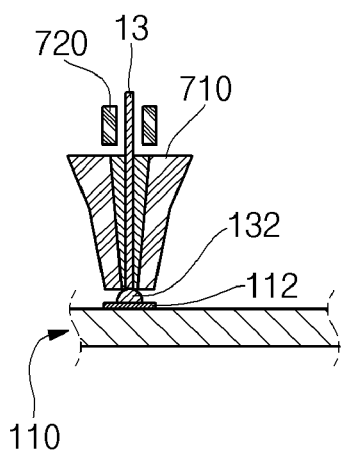

As illustrated in FIG. 9C, in a state in which the clamp 720 unclamps the wire 13, ultrasonic waves are supplied to bond the free air ball 13a of the wire 13 while pressing the second circuit pattern 112 of the substrate 110 from the bottom end of the capillary 710. As a result, the ball-bonding region 132 is formed on the second circuit pattern 112.

Figure 9D:
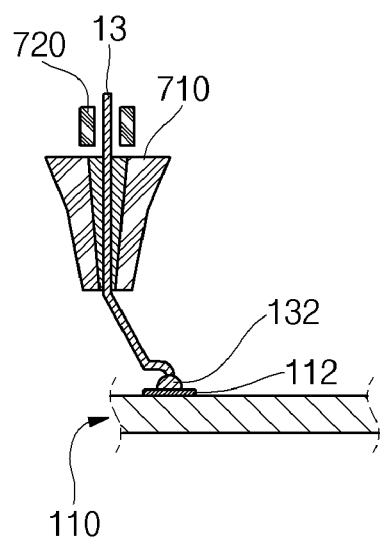

As illustrated in FIG. 9D, in a state in which the clamp 720 unclamps the wire 13, the capillary 710 performs wire looping. For example, the capillary 710 performs wire looping along a predetermined route by, but not limited to, moving to the upper-left side and then moving to the right side.

Figure 9E:
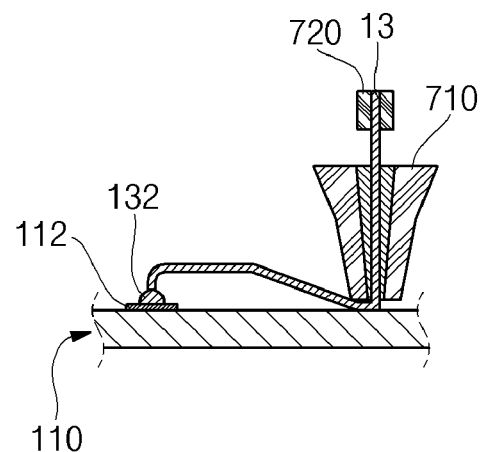

As illustrated in FIG. 9E, after the capillary 710 moves to a region of the underlying substrate 110 (for example, moves to a dummy pattern), an operation similar to a stitch bonding operation is performed. For example, the capillary 710 provides only downward forces to the wire 13 while not supplying ultrasonic waves. Therefore, even though a region of the wire 13 corresponding to the bottom end of the capillary 710 is reduced, stitch bonding is not actually performed.

Figure 9F:
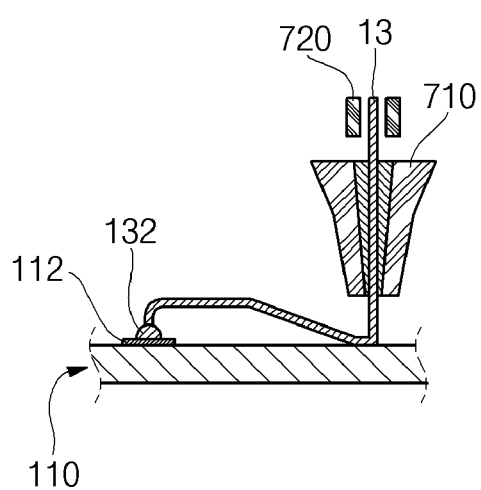

As illustrated in FIG. 9F, in a state in which the clamp 720 unclamps the wire 13, the capillary 710 is elevated to a predetermined height. As a result, the capillary 710 secures a predetermined extra wire length from the stitch bonding region.

Figure 9G:
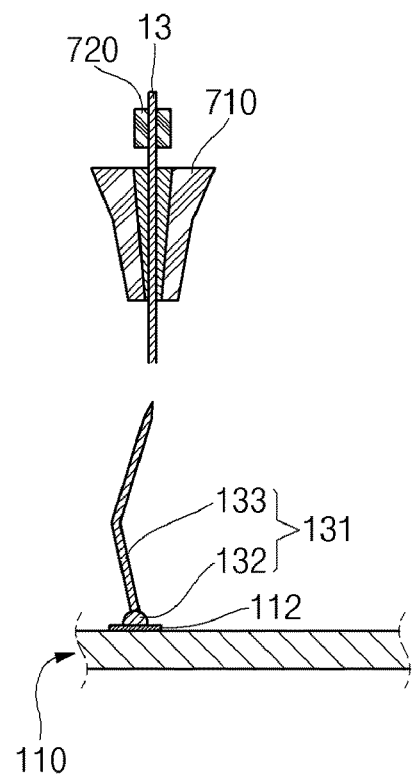

As illustrated in FIG. 9G, in a state in which the clamp 720 clamps the wire 13, wire looping is performed. That is to say, to attain the conductive wire 131, the capillary 710 moves to an upper side of the ball-bonding region 132. Next, in the state in which the clamp 720 clamps the wire 13, the capillary 710 is further elevated to a predetermined height by an increased force. Then, the extending wire region 133 of the wire 13 having a diameter reduced by the stitch bonding is severed. In one embodiment, the ball-bonding region 132 of the wire 13 is not separated from the second circuit pattern 112 but is severed at its region having a reduced diameter as the result of the stitch bonding, thereby providing the extending wire region 133 having a predetermined length.

Through the above-described process, the conductive wire 131, including the ball-bonding region 132 and the extending wire region 133 substantially perpendicular to the ball-bonding region 132, is formed adjacent the second circuit pattern 112. This process is repeatedly performed, thereby forming the internal shielding structure 130 in proximity to selected electronic components also disposed on the substrate 110 (for example, semiconductor dies 120A and 120B). In one embodiment, due to various wire-looping routes of the capillary 710, the conductive wire 131 can be formed in a substantially bent line configuration, not in a straight line. As set forth previously, it will be understood by those skilled in the art that the conductive pillar structures described herein can be formed by other techniques, such as plating or sputtering, not just by wire bonding.

Figure 10A:
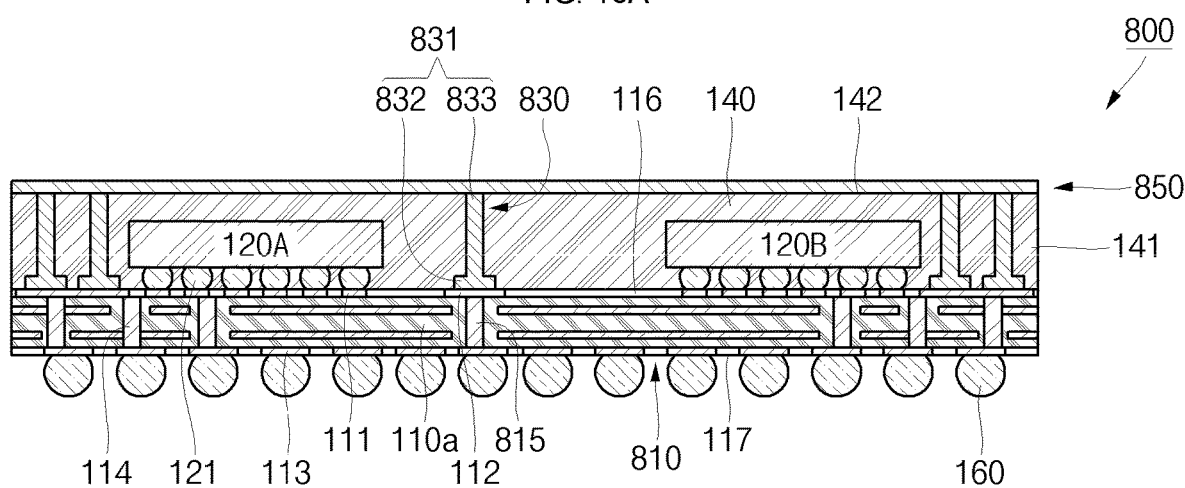
FIGS. 10A and 10B illustrate a cross-sectional view and a plan view of an electronic device according to various embodiments of the present invention.
Figure 10B:
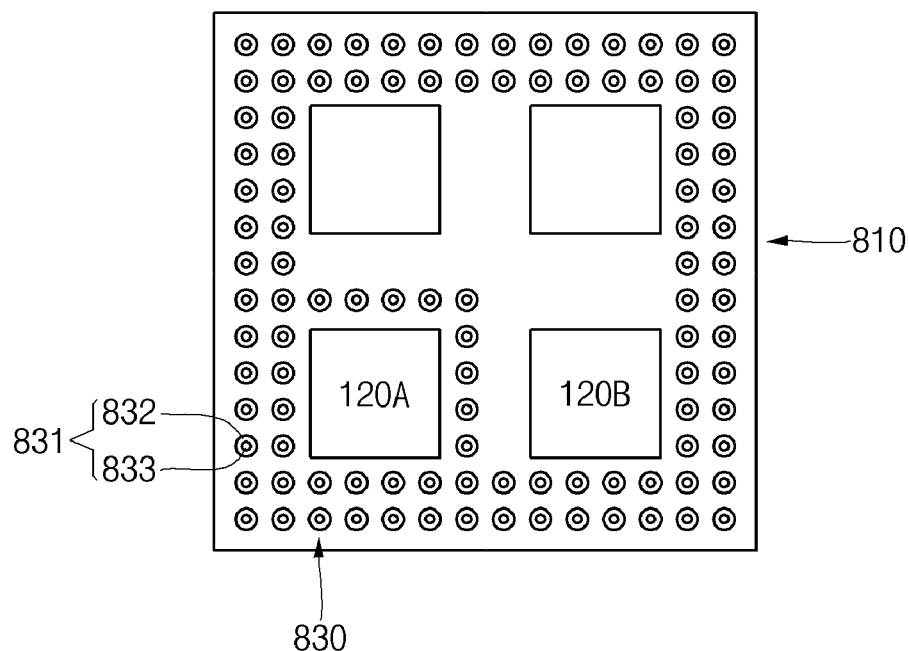

FIGS. 10A and 10B illustrate a cross-sectional view and a plan view of an electronic device 800, such as a semiconductor device 800 according to another embodiment. The semiconductor device 800 illustrated in FIGS. 10A and 10B is similar to the semiconductor device 100 illustrated in FIGS. 1A and 1B, and only the differences between the semiconductor devices 100 and 800 will be described hereinafter.

As illustrated in FIGS. 10A and 10B, the semiconductor device 800 can be configured such that a conductive wire 831 of an internal shielding structure 830 is electrically connected to a ground conductive via 815 of a substrate 810. In accordance with one embodiment, a ball-bonding region 832 of the conductive wire 831 is bonded to a second circuit pattern 112, which can be electrically connected to the ground conductive via 815.

In addition, a shielding layer 850 can be formed only on the second surface 142 of the package body 140, which encapsulates semiconductor die 120A, the semiconductor die 120B, and the internal shielding structure 830. That is, in some embodiments the shielding layer 850 may not be formed on the first surfaces 141 of the package body 140. In some embodiments, the first surfaces 141 of the package body 140 can be substantially coplanar with edges of the substrate 110 as generally illustrated in FIG. 10A.

Additionally, an end (that is, a distal end) of the conductive wire 831 of the internal shielding structure 830 is electrically connected to the shielding layer 850 through the package body 140 as generally illustrated in FIG. 10A. In some embodiments, since the shielding layer 850 is not formed on the first surfaces 141 of the package body 140 or the side surfaces of the substrate 810, the conductive wires 831 of the internal shielding structure 830 facilitate an electrical connection of the shielding layer 850 to the ground conductive via 815 through the second circuit pattern 112. It is understood that the embodiment of FIG. 1C also can be used to facilitate the electrical connection of the conductive wires 831 to the shielding layer 850. In other embodiments, the distal end of the conductive wires 831 of the internal shielding structure 830 can be spaced apart (that is, electrically disconnected) from the shielding layer 850, and the shielding layer 850 can be electrically connected to ground, for example, by using a connective structure external to the semiconductor device 800.

Further, the internal shielding structure 830 can be formed between the first surfaces 141 of the package body 140 and the semiconductor dies 120A and 120B using one or more rows of conductive wires 831. More particularly, the EMI generated from upper regions of the semiconductor dies 120A and 120B is shielded by the shielding layer 850 while the EMI generated from side regions of the semiconductor dies 120A and 120B is shielded by the internal shielding structure 830.

In accordance with the present embodiment, the semiconductor die 120A can be completely enclosed or surrounded by the conductive wires 831 as generally illustrated in FIG. 10B. In some embodiments, the conductive wires 831 may completely enclose each side of the particular semiconductor die 120A. As a result, the EMI can be efficiently shielded between the particular semiconductor die 120A and the other semiconductor die(s), such as the semiconductor die 120B adjacent thereto. In other embodiments, conductive wires 831 may completely surround and separate each of the electronic components within semiconductor device 800. It is understood that although two rows of the conductive wires 831 are illustrated in FIG. 10B around the peripheral edges of the substrate 810, less rows, or more rows can be used in accordance with application requirements. In addition, more than one row can be used between adjacent electrical components.

Figure 11:
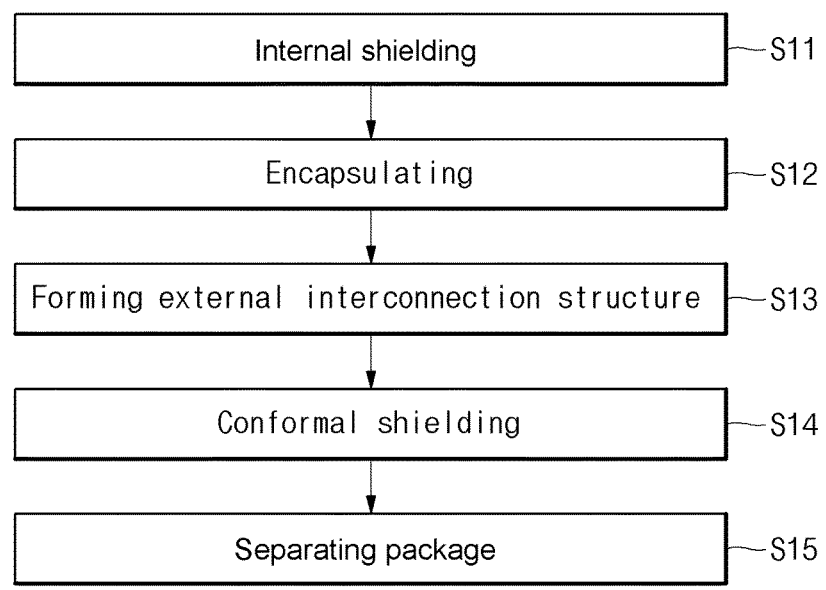
FIG. 11 is a flowchart of a manufacturing method of an electronic device according to various embodiments of the present invention.

FIG. 11 illustrates a flowchart of a manufacturing method for providing semiconductor device 800 according to various embodiments. As illustrated in FIG. 11, the manufacturing method may include internal shielding (S11), encapsulating (S12), forming an external interconnection structure (S13), conformal shielding (S14), and singulating or sawing a package (S15). The manufacturing method according to various embodiments of the present invention may further include preparing a substrate and bonding semiconductor dies, which are, however, not essential features of the present invention and a detailed description thereof will not be given. Those skilled in the art will recognize that the manufacturing method according to the present embodiment may include other steps, such as preparing a substrate and bonding electronic components. However, the detailed description of these known steps will not be given.

Figure 12A:
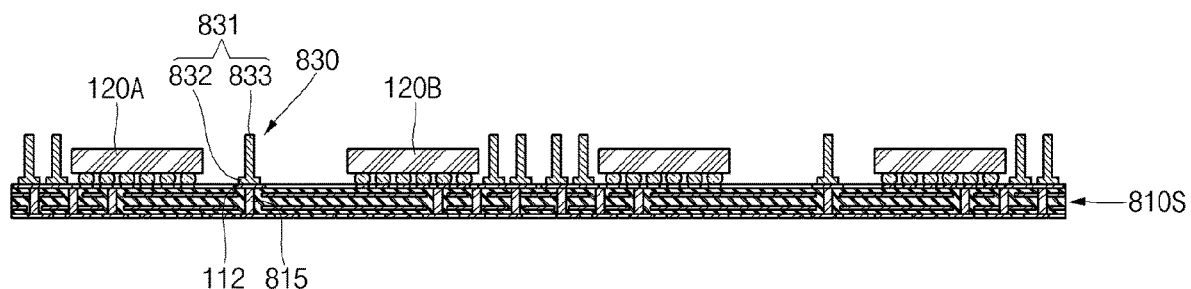
FIGS. 12A, 12B, 12C, 12D, and 12E are cross-sectional views illustrating a manufacturing method of an electronic device according to various embodiments of the present invention.

FIGS. 12A to 12E illustrate cross-sectional views of a manufacturing method for forming semiconductor device 800 in accordance with FIG. 11. As illustrated in FIG. 12A, in the step of internal shielding (S11), the internal shielding structure 830 is provided by forming conductive pillar structures 831, such as the conductive wires 831 attached to a substrate strip 810S in proximity to the semiconductor dies 120A and 120B. First ends, such as the proximate ends, of the conductive wires 831 are ball-bonded to a second circuit pattern 112 of the substrate strip 810S by, for example, a wire bonder, and second ends of the conductive wires 831 are upwardly extended a predetermined length, which are then severed to provide the conductive wires 831 extending away from the substrate strip 810S in a generally orthogonal (for example, vertical) manner. In accordance with the present embodiment, the distal ends of the conductive wires 831 are not attached to the substrate 810S. In some embodiments, a ball-bonding region 832 is formed on the second circuit pattern 112 by the wire bonder, and an extending wire region 833 upwardly extending a predetermined length from the ball-bonding region 832 is then formed, thereby providing the conductive wires 831 of the internal shielding structure 830. In some embodiments, heights (or lengths) of the conductive wires 831 can be greater than thicknesses (or heights) of the semiconductor dies 120A and 120B. That is, the distal ends of the conductive wires 831 extend above the substrate 810S to a greater extent than the semiconductor dies 120A and 120B. In some embodiments, the second circuit pattern 112 can be connected to a ground conductive via 815.

In accordance with the present embodiment, the substrate is processed on a strip basis, not on a unit basis. More particularly, in the manufacturing method illustrated in FIGS. 7, 8A to 8C, the substrate is processed or encapsulated on a unit basis (that is, unit molded). However, in the present embodiment, the substrate is processed or encapsulated on a strip basis (that is, strip-molded or gang-molded). In the present embodiment, the substrate strip 810S includes a plurality of substrate units that are over-molded, strip-molded or gang-molded.

Figure 12B:
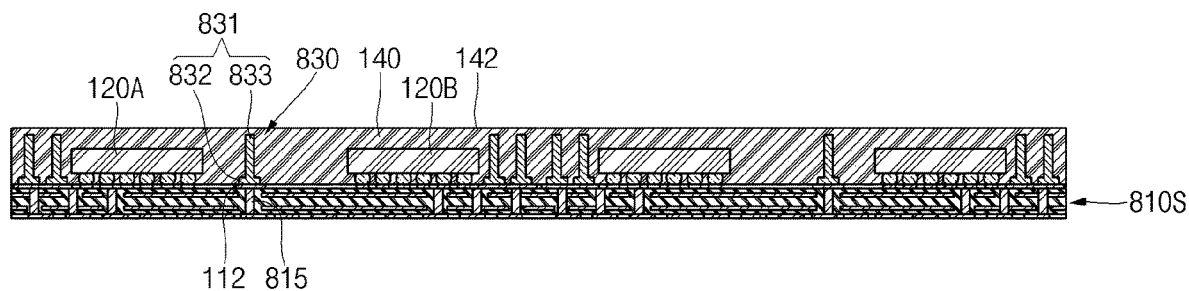

As illustrated in FIG. 12B, in the step of encapsulating (S12), the semiconductor die 120A, the semiconductor die 120B, and the internal shielding structure 830 disposed on the substrate strip 810S are encapsulated by an encapsulant to provide the package body 140. More particularly, the semiconductor dies and internal shielding structures are provided on the substrate strip 810S for each of a plurality of units, and the sub-assembly is then strip-molded or gang-molded using a single encapsulant structure, thereby constituting a continuous package body.

Figure 12C:
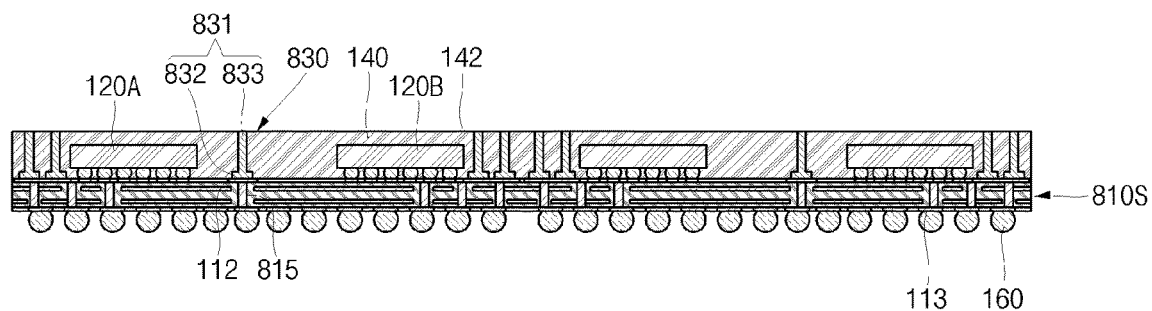

The step of encapsulating (S12) can be performed using, for example, general compression molding (that is, using liquid, powder and/or a film), vacuum molding, transfer molding, over-molding, film-assisted molding, or other techniques known to those skilled in the art. In some embodiments, the thickness of the package body 140 is greater than a height (or length) of the internal shielding structure 830, specifically the conductive wires 831, and the package body 140 may completely encapsulate the semiconductor dies 120A and 120B and the internal shielding structure 830 as generally illustrated in FIG. 12B. After the step of encapsulating (S12), in some embodiments a removal step, such as a grinding step or a laser ablation step is performed on the second surface 142 (that is, a top surface) of the package body 140, thereby exposing distal ends of the internal shielding structure 830 to the outside of the package body 140 as generally illustrated in FIG. 12C. It is understood that other configurations described herein can be used to facilitate electrical connection between the conductive wires 831 and the shielding layer 850 including, but not limited to, the configuration described in FIGS. 1C, 4, 5, and 6.

As illustrated in FIG. 12C, in the step of forming external interconnection structure (S13), the external interconnection structure 160 can be formed on a third circuit pattern 113 formed on a bottom surface of the substrate strip 810S. For example, the external interconnection structure 160 may include metal pillars, solder bumps, solder balls, bumps, lands, or other structures known to those skilled in the art. In some embodiments, the external interconnection structure 160 may include about 100 micron to about 200 micron thick bumps or about 20 micron to about 100 micron thick bumps/pillars. When solder bumps are used for the external interconnection structure 160, the external interconnection structure 160 may include at least one solder metal melted at a lower temperature than other metals. In addition, for example, the external interconnection structure 160 may include, but not limited to, a ball grid array (BGA) and/or a land grid array (LGA).

Figure 12D:
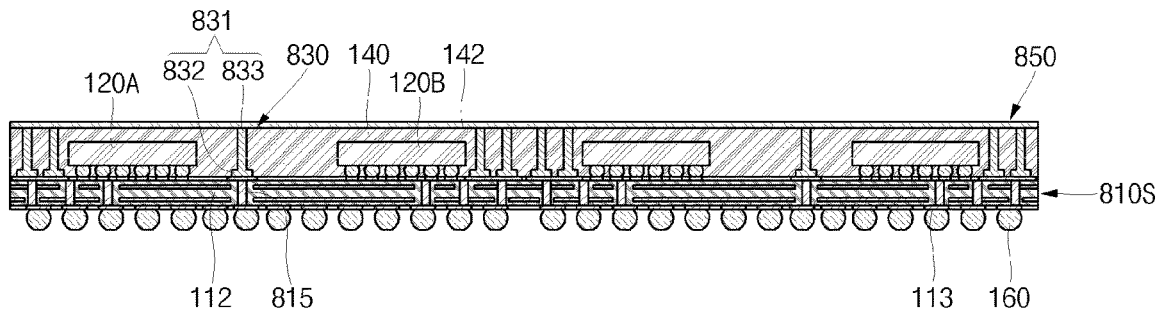

As illustrated in FIG. 12D, in the step of conformal shielding (S14), the shielding layer 850 is formed only on the second surface 142 (that is, only on the top surface) of the package body 140. In the present embodiment, the shielding layer 850 can be electrically connected to the ground conductive via 815 through the conductive wires 831 and the second circuit pattern 112. In instances where the shielding layer 850 is not electrically connected to conductive wires 831, the shielding layer 850 can be connected to ground using an external interconnection structure when semiconductor device 800 is attached to a next level of assembly, such as a printed circuit board. The shielding layer 850 can be formed by, for example, spin coating, spraying, plating, sputtering, a combination thereof, or other processes known to those skilled in the art.

Figure 12E:
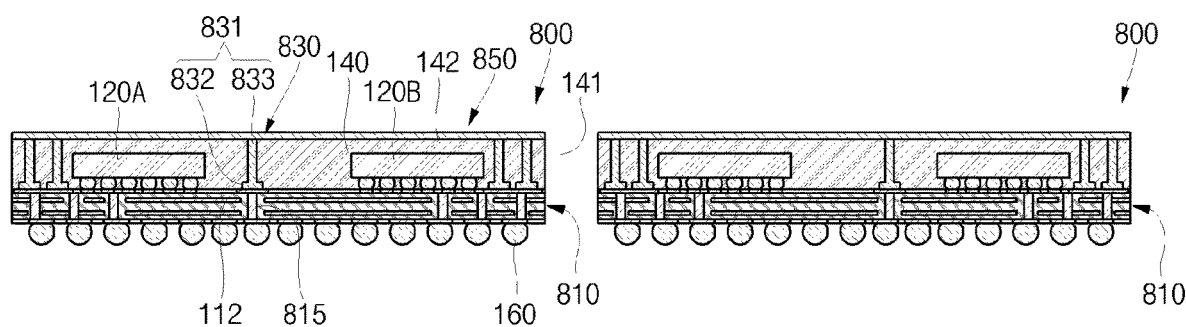

As illustrated in FIG. 12E, in the step of separating the package (S15), the substrate strip 810S is separated using, for example, a sawing process to provide individual substrate units 810. More particularly, a region of the substrate strip 810S and a region of the package body 140 corresponding to the region of the substrate strip 810S are separated at the same time using a separation process, such as a sawing process, a laser process, or other processes known to those skilled in the art.

Through the above-described process, the plurality of first surfaces 141 are provided around the package body 140 and the first surfaces 141 are coplanar with side surfaces of the substrate unit 810. Moreover, the shielding layer 850 does not exist on the first surfaces 141 of the package body 140 or the side surfaces of the substrate 810. More particularly, the first surfaces 141 of the package body 140 and the side surfaces of the substrate 810 are directly exposed to the outside. However, since the grounded internal shielding structure 830 (that is, the conductive wires 831) are provided between the first surfaces 141 of the package body 140 and the semiconductor dies 120A and 120B, there is no radiation of EMI from the semiconductor dies 120A and 120B through the first surfaces 141 of the package body 140. In addition, the internal shielding structure 830 shields the electronic components (for example, the semiconductor dies 120A and 120B) within the semiconductor device 800 from external EMI radiation.

Figure 13:
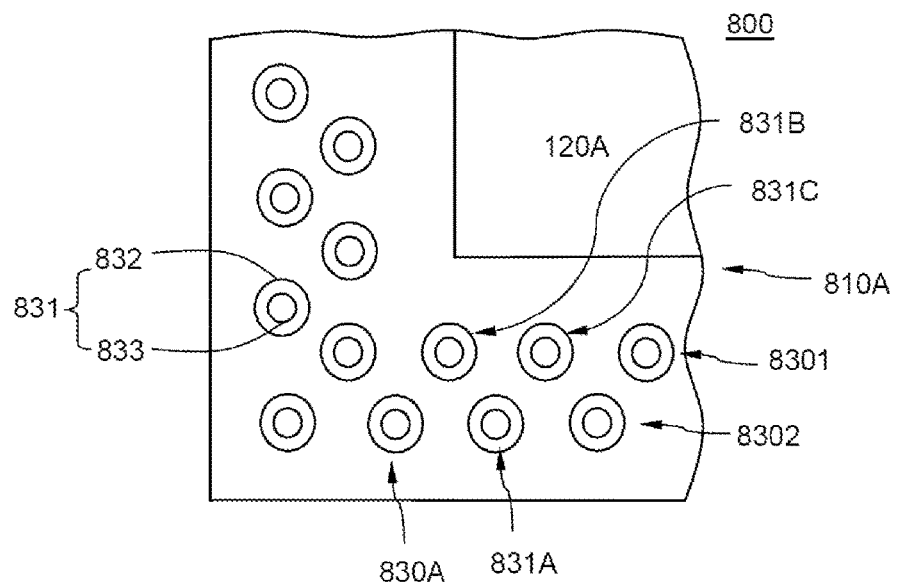
FIG. 13 illustrates a partial plan view of an electronic device in accordance with another embodiment of the present invention.

FIG. 13 illustrates a partial plan view of the semiconductor device 800 in accordance with an alternative embodiment. In the present embodiment, a substrate 810A is provided with electronic components including the semiconductor die 120A, and the conductive wires 831 are disposed adjacent the substrate 810A in a plurality of rows 8301 and 8302 to form internal shielding structure 830A. In the present embodiment, rows 8301 and 8302 are laterally offset with respect to each so that, for example, one of the conductive wires 831 (for example, 831A) in the row 8302 is interposed between a pair of conductive wires 831 (for example, conductive wires 831B and 831C) in the row 8301. In accordance with the present embodiment, the offset configuration can further improve EMI shielding in some applications. It is understood that other embodiments described herein may use additional rows that are offset from neighboring rows.

In view of all of the above, it is evident that a novel structure and method for making electronic devices, such semiconductor devices, with improved reliability have been disclosed. Included, among other features, are conductive pillars disposed on a surface of substrate in proximity to electronic components to provide an internal shielding structure. In some embodiments, the conductive pillars are conductive wires formed using cost-effective wire-bonding techniques. In some embodiments, a shielding layer is provided on one or more surfaces of a package body that encapsulates the electronic components and the internal shielding structure. In embodiments, the shielding layer is electrically connected to the conductive pillars either through the package body or through the substrate. The present structure and method also facilitate the use of strip-type substrates as well as unit-type substrates.

As stated herein, the scope of the present disclosure is not limited to the specific example method blocks (or associated structures) discussed. For example, various blocks (or portions thereof) can be removed from or added to the example methods, various blocks (or portions thereof) can be reordered, various blocks (or portions thereof can be modified), etc. For example, the electronic component can be attached after the internal shielding structure is formed.

While the subject matter of this disclosure is described with specific preferred embodiments and example embodiments, the foregoing drawings and descriptions thereof depict only illustrative embodiments of the subject matter, and are not therefore to be considered limiting of its scope. It is evident that many alternatives and variations will be apparent to those skilled in the art. For example, packaged semiconductor die can be used for the first semiconductor die and/or the semiconductor die in a package within a package configuration. In addition, the structures and elements described herein can be used with other substrate types.

As the claims hereinafter reflect, inventive aspects may lie in less than all features of a single foregoing disclosed embodiment. Thus, the claims hereinafter expressed hereby are expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. An electronic device structure, comprising:
a substrate comprising a substrate top side, a substrate bottom side opposite to the substrate top side, a substrate lateral side connecting the substrate top side to the substrate bottom side, and a ground conductive via extending through the substrate from the substrate top side to the substrate bottom side;
conductive wires comprising proximate ends wire-bonded to the substrate top side and distal ends spaced apart from the substrate top side, wherein:
a first portion of the conductive wires are wire-bonded proximate to the substrate lateral side to define an outer perimeter adjacent to the substrate lateral side that surrounds a central portion of the substrate top side;
the outer perimeter has a least one row of the conductive wires; and
each of the conductive wires including all of the first portion of the conductive wires is a shielding wire coupled to the ground conductive via;
a first electronic component coupled to the substrate top side in the central portion;
a package body encapsulating the first electronic component and the conductive wires, wherein:
the package body extends to the substrate lateral side and covers the substrate top side; and
the package body has a package body top side and a package body lateral side having side portions in a cross-sectional view; and
a conductive shielding layer over the package body top side but not over the package body lateral side;
wherein:
the conductive shielding layer overlaps the first electronic component;
the conductive shielding layer and the conductive wires are a shielding structure for the electronic device structure; and
a distal end of at least one of the conductive wires contacts the conductive shielding layer at a location at or below the package body top side.

2. The electronic device structure of claim 1, wherein:
the distal end of the at least one of the conductive wires is a generally planar surface; and
the distal end of the at least one of the conductive wires does not extend into the conductive shielding layer.

3. The electronic device structure of claim 1, further comprising:
a second electronic component coupled to the substrate top side in the central portion and laterally spaced apart from the first electronic component;
wherein:
a second portion of the conductive wires is interposed between the first electronic component and the second electronic component.

4. The electronic device structure of claim 1, wherein:
each of the distal ends of the conductive wires contact the conductive shielding layer at a location at or below the package body top side.

5. The electronic device structure of claim 1, wherein:
the conductive shielding layer has a conductive shielding layer top side; and
the conductive shielding layer top side is an outermost surface of the electronic device structure.

6. The electronic device structure of claim 5, wherein:
the conductive shielding layer top side is devoid of electronic components.

7. The electronic device structure of claim 1, wherein:
The outer perimeter has at least two rows of the conductive wires.

8. The electronic device structure of claim 7, wherein:
the at least two rows are offset with respect to each other.

9. The electronic device structure of claim 1, wherein:
the package body top side comprises a recess that exposes the distal end of the at least one of the conductive wires;
the recess comprises a recess bottom side offset inward with respect to the package body top side;
the distal end of the at least one of the conductive wires is coplanar with the recess bottom side; and
the conductive shielding layer extends into the recess and contacts the distal end of the at least one of conductive wires in the recess.

10. The electronic device structure of claim 1, wherein:
the substrate top side comprises a first area;
the package body top side comprises a second area;
the conductive shielding layer comprises a third area; and
the first area equals the second area.

11. The electronic device structure of claim 10, wherein:
the third area equals the first area and the second area.

12. The electronic device structure of claim 1, wherein:
the conductive shielding layer is a deposited conformal layer.

13. The electronic device structure of claim 1, wherein:
all of the conductive wires comprise substantially a same height;
each of the distal ends is electrically connected to the conductive shielding layer; and
the electronic device structure is devoid of any embedded vertical interconnects that extend through the package body configured to individually connect to an external electronic component.

14. The electronic device structure of claim 1, wherein:
all the conductive wires within the electronic device structure are embedded within the package body that comprises a single layer; and
all the conductive wires are electrically connected together so that none of the conductive wires comprises a vertical interconnect configured to individually electrically connect to an electronic component external to the electronic device structure.

15. An electronic device structure, comprising:
a substrate comprising a substrate top side, a substrate bottom side opposite to the substrate top side, a substrate lateral side connecting the substrate top side to the substrate bottom side, and a ground conductive via extending through the substrate from the substrate top side to the substrate bottom side;
conductive wires comprising proximate ends wire-bonded to the substrate top side and distal ends spaced apart from the substrate top side so that the conductive wires are vertically oriented conductive wires, wherein:

the vertically oriented conductive wires are wire-bonded proximate to the substrate lateral side to define an outer perimeter adjacent to the substrate lateral side that surrounds a central portion of the substrate top side;

each of the vertically oriented conductive wires are coupled to the ground conductive via;

the outer perimeter has a least one row of vertically oriented conductive wires; and the only vertically oriented conductive wires in the at least one row are vertically oriented conductive wires consisting of shielding wires;

a first electronic component coupled to the substrate within the central portion;

a package body encapsulating the first electronic component and the vertically oriented conductive wires, wherein:

the package body extends to the substrate lateral side and covers the substrate top side; and the package body has a package body top side and a package body lateral side having side portions in a cross-sectional view; and a conductive shielding layer over the package body top side but not over the package body lateral side;

wherein:

the conductive shielding layer and the vertically oriented conductive wires are a shielding structure for the electronic device structure; and all the vertically oriented conductive wires that are coupled to the substrate top side are electrically coupled to the conductive shielding layer.

16. The electronic device structure of claim 15, wherein:
the conductive shielding layer comprises a conductive shielding layer top side; and
the conductive shielding layer top side is an outermost surface of the electronic device structure.

17. The electronic device structure of claim 16, wherein:
the conductive shielding layer top side is devoid of electronic components.

18. An electronic device structure, comprising:
a substrate comprising a substrate top side, a substrate bottom side opposite to the substrate top side, a substrate lateral side connecting the substrate top side to the substrate bottom side, and a ground conductive via extending through the substrate from the substrate top side to the substrate bottom side;

vertically oriented conductive wires comprising proximate ends wire-bonded to the substrate top side and distal ends spaced apart and disconnected from the substrate top side, wherein:

the vertically oriented conductive wires are wire-bonded proximate to the substrate lateral side to define an outer perimeter adjacent to the substrate lateral side that surrounds a central portion of the substrate top side;

all of the vertically oriented conductive wires are coupled to the ground conductive via; and the outer perimeter has a least one row of the vertically oriented conductive wires;

a first electronic component coupled to the substrate in the central portion;

a second electronic component coupled to the substrate in the central portion and laterally spaced apart from the first electronic component;

a package body encapsulating the first electronic component and the vertically oriented conductive wires, wherein:

the package body extends to the substrate lateral side and covers the substrate top side; and the package body comprises a package body top side and a package body lateral side having side portions in a cross-sectional view; and a conductive shielding layer over the package body top side but not over the package body lateral side;

wherein:

a portion of the vertically oriented conductive wires is interposed between the first electronic component and the second electronic component;

the conductive shielding layer and the vertically oriented conductive wires are a shielding structure for the electronic device structure; and all the vertically oriented conductive wires within the electronic device structure are electrically coupled together.

19. The electronic device structure of claim 18, wherein:
the package body top side comprises a recess that exposes the distal end of at least one vertically oriented conductive wire;
the recess comprises a recess bottom side offset inward with respect to the package body top side;
the distal end of the at least one vertically oriented conductive wires is coplanar with the recess bottom side; and
the conductive shielding layer extends into the recess and contacts the distal end of the at least one vertically oriented conductive wire in the recess.

20. The electronic device structure of claim 18, wherein:
the conductive shielding layer comprises a conductive shielding layer top side;
the conductive shielding layer top side is an outermost surface of the electronic device structure; and
the conductive shielding layer top side is devoid of electronic components.

* * * * *